United States Patent
Ohno et al.

(10) Patent No.: US 10,651,061 B2
(45) Date of Patent: May 12, 2020

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventors: Hiroki Ohno, Tokyo (JP); Takao Inada, Koshi (JP); Hisashi Kawano, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 21 days.

(21) Appl. No.: 16/163,918

(22) Filed: Oct. 18, 2018

(65) Prior Publication Data
US 2019/0122905 A1    Apr. 25, 2019

(30) Foreign Application Priority Data

Oct. 19, 2017 (JP) .................................. 2017-202496

(51) Int. Cl.
*H01L 21/66* (2006.01)
*H01L 21/67* (2006.01)
*H01L 21/311* (2006.01)

(52) U.S. Cl.
CPC .. *H01L 21/67086* (2013.01); *H01L 21/31111* (2013.01); *H01L 21/67173* (2013.01); *H01L 21/67253* (2013.01); *H01L 22/26* (2013.01)

(58) Field of Classification Search
CPC ......... H01L 21/31111; H01L 21/67086; H01L 21/67017; H01L 21/67057; H01L 21/30604; H01L 21/67075; H01L 22/26; H01L 21/67248

See application file for complete search history.

(56) References Cited

U.S. PATENT DOCUMENTS

2019/0148183 A1* 5/2019 Inada ................ H01L 21/67253
438/745

FOREIGN PATENT DOCUMENTS

JP    2013-232593 A    11/2013

* cited by examiner

*Primary Examiner* — Jaehwan Oh
(74) *Attorney, Agent, or Firm* — Pearne & Gordon LLP (57) ABSTRACT

A substrate processing apparatus includes a processing unit and a control unit. The processing unit is configured to perform an etching processing by immersing a substrate in a processing liquid containing phosphoric acid and a silicon-containing compound. The control unit is configured to control the processing liquid such that the substrate is processed, in a first processing time of the etching processing, with the processing liquid having a first phosphoric acid concentration and a first silicon concentration, and the substrate is processed, in a second processing time later than the first processing time, with the processing liquid having a second preset phosphoric acid concentration lower than the first phosphoric acid concentration and a second preset silicon concentration lower than the first silicon concentration or with the processing liquid having the second preset phosphoric acid concentration and the first silicon concentration.

14 Claims, 8 Drawing Sheets

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application No. 2017-202496 filed on Oct. 19, 2017, the entire disclosures of which are incorporated herein by reference.

TECHNICAL FIELD

The various aspects and embodiments described herein pertain generally to a substrate processing apparatus, a substrate processing method and a recording medium.

BACKGROUND

Conventionally, in a substrate processing apparatus, there is known an etching processing of selectively etching, between a silicon nitride film (SiN) and a silicon oxide film ($SiO_2$) formed on a substrate, the silicon nitride film by immersing the substrate in a phosphoric acid processing liquid (see Patent Document 1).

In order to etch the silicon nitride film selectively, it is desirable to improve selectivity, which is a ratio of an etching rate of the silicon nitride film with respect to an etching rate of the silicon oxide film, in a latter stage of the etching processing.

Patent Document 1: Japanese Patent Laid-open Publication No. 2013-232593

In the aforementioned substrate processing apparatus, however, since a silicon component is eluted from the substrate as the etching processing progresses, there is a concern that a silicon oxide ($SiO_2$) may be precipitated on the silicon oxide film.

SUMMARY

In view of the foregoing, exemplary embodiments provide a substrate processing apparatus, a substrate processing method and a recording medium capable of performing an etching processing with high accuracy by improving selectivity while suppressing precipitation of a silicon oxide.

In one exemplary embodiment, a substrate processing apparatus includes a processing unit and a control unit. The processing unit is configured to perform an etching processing by immersing a substrate in a processing liquid containing phosphoric acid and a silicon-containing compound. The control unit is configured to control the processing liquid such that the substrate is processed, in a first processing time of the etching processing, with the processing liquid having a first phosphoric acid concentration and a first silicon concentration, and the substrate is processed, in a second processing time later than the first processing time, with the processing liquid having a second preset phosphoric acid concentration lower than the first phosphoric acid concentration and a second preset silicon concentration lower than the first silicon concentration or with the processing liquid having the second preset phosphoric acid concentration and the first silicon concentration.

According to the exemplary embodiments, it is possible to perform the etching processing with high accuracy by improving the selectivity while suppressing the precipitation of the silicon oxide.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing apparatus, a substrate processing method and a recording medium according to exemplary embodiments will be described in detail with reference to accompanying drawings. Here, however, it should be noted that the exemplary embodiments are not limiting.

Figure 1:
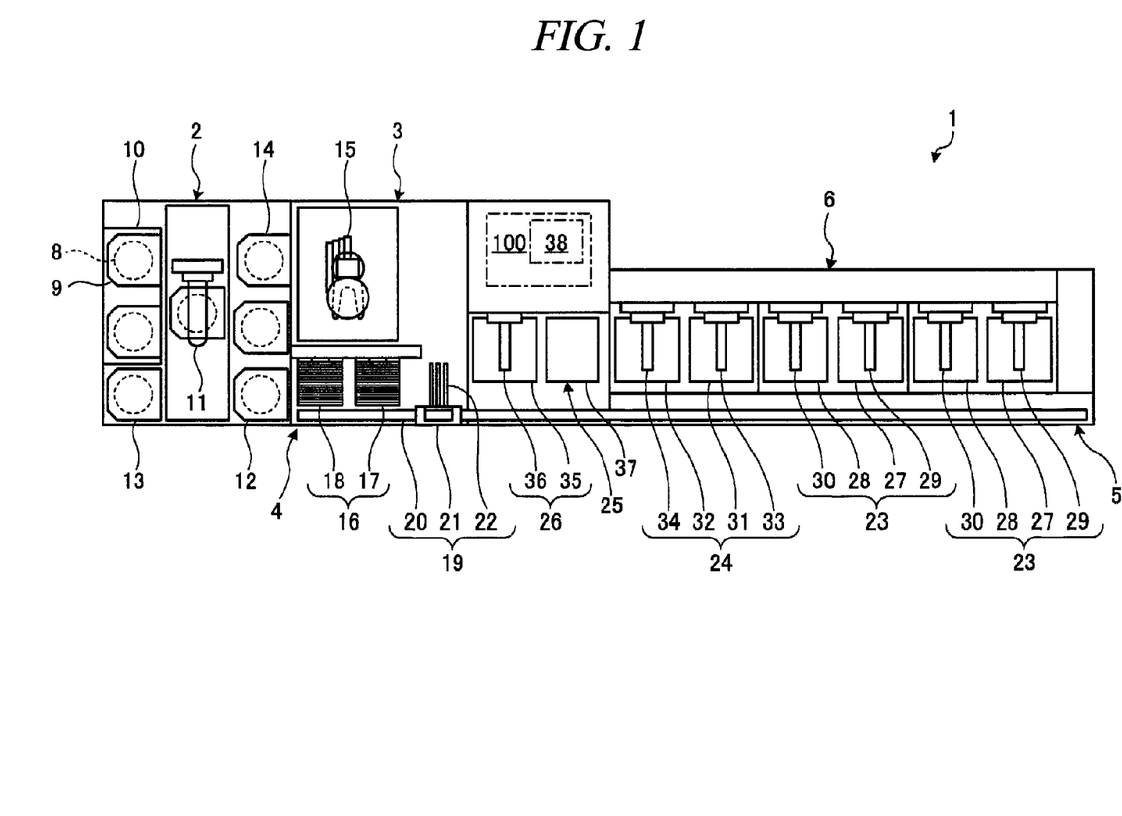
FIG. 1 is a schematic plan view of a substrate processing apparatus.

As depicted in FIG. 1, a substrate processing apparatus 1 according to an exemplary embodiment includes a carrier carry-in/out unit 2, a lot forming unit 3, a lot placing unit 4, a lot transferring unit 5, a lot processing unit 6 and a control unit 100. FIG. 1 is a schematic plan view of the substrate processing apparatus 1. Here, a direction orthogonal to a horizontal direction will be defined as a vertical direction.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture.

The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table 14 configured to place the carrier 9 thereon.

The carrier carry-in/out unit 2 transfers the carrier 9, which is carried onto the carrier stage 10 from the outside, to the carrier stock 12 or the carrier placing table 14 by using the carrier transfer device 11. That is, the carrier carry-in/out unit 2 transfers the carrier 9 accommodating therein the plurality of substrates 8 before being processed by the lot processing unit 6 to the carrier stock 12 or the carrier placing table 14.

The carrier stock 12 temporarily places therein the carrier 9 which accommodates therein the plurality of substrates 8 before being processed by the lot processing unit 6.

The plurality of substrates 8 are carried out from the carrier 9, which is carried onto the carrier placing table 14 while accommodating therein the plurality of substrates 8 before being processed by the lot processing unit 6, by a substrate transfer device 15 to be described later.

Further, the plurality of substrates 8 after being processed by the lot processing unit 6 is carried from the substrate transfer device 15 into the carrier 9 which is placed on the carrier placing table 14 and does not accommodate the substrates 8 therein.

The carrier carry-in/out unit 2 carries the carrier 9, which is placed on the carrier placing table 14 and accommodates therein the plurality of substrates 8 after being processed by the lot processing unit 6, to the carrier stock 13 or the carrier stage 10 by using the carrier transfer device 11.

The carrier stock 13 temporarily accommodates therein the plurality of substrates 8 after being processed by the lot processing unit 6. The carrier 9 transferred to the carrier stage 10 is carried to the outside.

The lot forming unit 3 is equipped with the substrate transfer device 15 configured to transfer a plurality (e.g., 25 sheets) of substrates 8. The lot forming unit 3 performs a transfer of the plurality (e.g., 25 sheets) of substrates 8 by the substrate transfer device 15 twice and forms a lot composed of a multiplicity (e.g., 50 sheets) of substrates 8.

The lot forming unit 3 forms the lot by transferring the multiplicity of substrates 8 from the carriers 9 placed on the carrier placing table 14 to the lot placing unit 4 by using the carrier transfer device 15 and placing the multiplicity of substrates 8 on the lot placing unit 4.

The multiplicity of substrates 8 belonging to the single lot are processed by the lot processing unit 6 at the same time. When forming the lot, the substrates 8 may be arranged such that surfaces thereof having patterns formed thereon face each other or such that the surfaces thereof having the patterns formed thereon all face to one direction.

Further, in the lot forming unit 3, the multiplicity of substrates 8 are transferred by the substrate transfer device 15 to the carrier 9 from the lot placed in the lot placing unit 4 after being subjected to the processing in the lot processing unit 6.

The substrate transfer device 15 is equipped with, as a substrate supporting unit configured to support the multiplicity of substrates 8, two types of substrate supporting unit: a before-processed substrate supporting unit (not shown) configured to support the substrates 8 before being subjected to a processing; and an after-processed substrate supporting unit (not shown) configured to support the processed substrates 8. Accordingly, particles or the like adhering to the substrates 8 before being processed may be suppressed from adhering to the substrates 8 after being processed.

The substrate transfer device 15 changes a posture of the substrates 8 from a horizontal posture to a vertical posture and from the vertical posture to the horizontal posture while transferring the substrates 8.

In the lot placing unit 4, the lot which is transferred between the lot forming unit 3 and the lot processing unit 6 by the lot transferring unit 5 is temporarily placed (stands by) on the lot placing table 16.

The lot placing unit 4 is equipped with a carry-in side lot placing table 17 and a carry-out side lot placing table 18.

The carry-in side lot placing table 17 is configured to place thereon the lot before being processed. The carry-out side lot placing table 18 is configured to place thereon the lot after being processed.

On each of the carry-in side lot placing table 17 and the carry-out side lot placing table 18, the multiplicity of substrates 8 corresponding to the single lot are arranged in a forward-backward direction with the vertical posture.

The lot transferring unit 5 is configured to transfer the lot between the lot placing unit 4 and the lot processing unit 6 and within the lot processing unit 6.

The lot transferring unit 5 is equipped with the lot transfer device 19 configured to transfer the lot. The lot transfer device 19 includes a rail 20 extended along the lot placing unit 4 and the lot processing unit 6; and a moving body 21 configured to be moved along the rail 20 while holding the lot.

The moving body 21 is provided with a substrate holding body 22 configured to hold the multiplicity of substrates 8 arranged in the forward-backward direction with the vertical posture.

The lot transferring unit 5 receives the lot placed on the carry-in side lot placing table 17 with the substrate holding body 22 of the lot transfer device 19 and delivers the received lot to the lot processing unit 6.

Further, the lot transferring unit 5 receives the lot processed by the lot processing unit 6 with the substrate holding body 22 of the lot transfer device 19 and delivers the received lot to the carry-out side lot placing table 18.

Further, the lot transferring unit 5 also performs the transfer of the lot within the lot processing unit 6 by using the lot transfer device 19.

The lot processing unit 6 is configured to perform a processing such as etching, cleaning and drying on the single lot composed of the multiplicity of substrates 8 arranged in the forward-backward direction with the vertical posture.

The lot processing unit 6 includes two etching apparatuses 23 configured to perform an etching processing on the lot; a cleaning apparatus 24 configured to perform a cleaning processing on the lot; a substrate holding body cleaning apparatus 25 configured to perform a cleaning processing on the substrate holding body 22; and a drying apparatus 26 configured to perform a drying processing on the lot. Further, the number of the etching apparatuses 23 is not limited to 2 and may be one or more than 2.

Each etching apparatus 23 includes a processing tub 27 for etching, a processing tub 28 for rinsing, and substrate elevating devices 29 and 30.

The processing tub 27 for etching stores therein a processing liquid for etching (hereinafter, referred to as "etching liquid"). The processing tub 28 for rinsing stores therein a processing liquid for rinsing (pure water or the like). Details of the processing tub 27 for etching will be described later.

The multiple number of substrates 8 constituting the single lot are held by the substrate elevating device 29 (30) while being arranged in the forward-backward direction with the vertical posture.

The etching apparatus 23 receives the lot from the substrate holding body 22 of the lot transfer device 19 with the substrate elevating device 29, and the received lot is moved up and down by the substrate elevating device 29. Accordingly, the lot is immersed in the etching liquid in the processing tub 27, so that an etching processing is performed. The etching processing is performed for, e.g., 60 min. The time period during which the etching processing is performed, however, is not limited to 60 min and may be, e.g., 90 min or 120 min. The etching apparatus 23 constitutes a processing unit.

Thereafter, the etching apparatus 23 takes out the lot from the processing tub 27 by raising the substrate elevating device 29, and delivers the lot to the substrate holding body 22 of the lot transfer device 19 from the substrate elevating device 29.

Then, the lot is received by the substrate elevating device 30 from the substrate holding body 22 of the lot transfer device 19, and the received lot is moved up and down by the substrate elevating device 30. Accordingly, the lot is immersed in the processing liquid for rinsing in the processing tub 28, so that a rinsing processing is performed.

Thereafter, the etching apparatus 23 takes out the lot from the processing tub 28 by raising the substrate elevating device 30, and delivers the lot to the substrate holding body 22 of the lot transfer device 19 from the substrate elevating device 30.

The cleaning apparatus 24 is equipped with a processing tub 31 for cleaning, a processing tub 32 for rinsing, and substrate elevating devices 33 and 34.

The processing tub 31 for cleaning stores therein a processing liquid for cleaning (SC-1 or the like). The processing tub 32 for rinsing stores therein a processing liquid for rinsing (pure water or the like). The multiplicity of substrates 8 belonging to the single lot are held by each of the substrate elevating devices 33 and 34 while being arranged in the forward-backward direction with the vertical posture.

The drying apparatus 26 is equipped with a processing tub 35 and a substrate elevating device 36 configured to be moved up and down with respect to the processing tub 35.

A processing gas for drying (IPA (isopropyl alcohol)) is supplied into the processing tub 35. The multiplicity of substrates 8 corresponding to the single lot are held by the substrate elevating device 36 while being arranged in the forward-backward direction with the vertical posture.

The drying apparatus 26 receives the lot from the substrate holding body 22 of the lot transfer device 19 with the substrate elevating device 36, and carries the received lot into the processing tub 35 by moving the receive lot up and down with the substrate elevating device 36. Then, a drying processing is performed on the lot by the processing gas for drying supplied into the processing tub 35. Thereafter, the drying apparatus 26 raises the lot with the substrate elevating device 36 and delivers the lot after being subject to the drying processing to the substrate holding body 22 of the lot transfer device 19 from the subtract elevating device 36.

The substrate holding body cleaning apparatus 25 includes a processing tub 37 and is configured to supply a processing liquid for cleaning and a drying gas into this processing tub 37. By supplying the drying gas after supplying the processing liquid for cleaning to the substrate holding body 22 of the lot transfer device 19, the substrate holding body cleaning apparatus 25 performs a cleaning processing on the substrate holding body 22.

Figure 2:
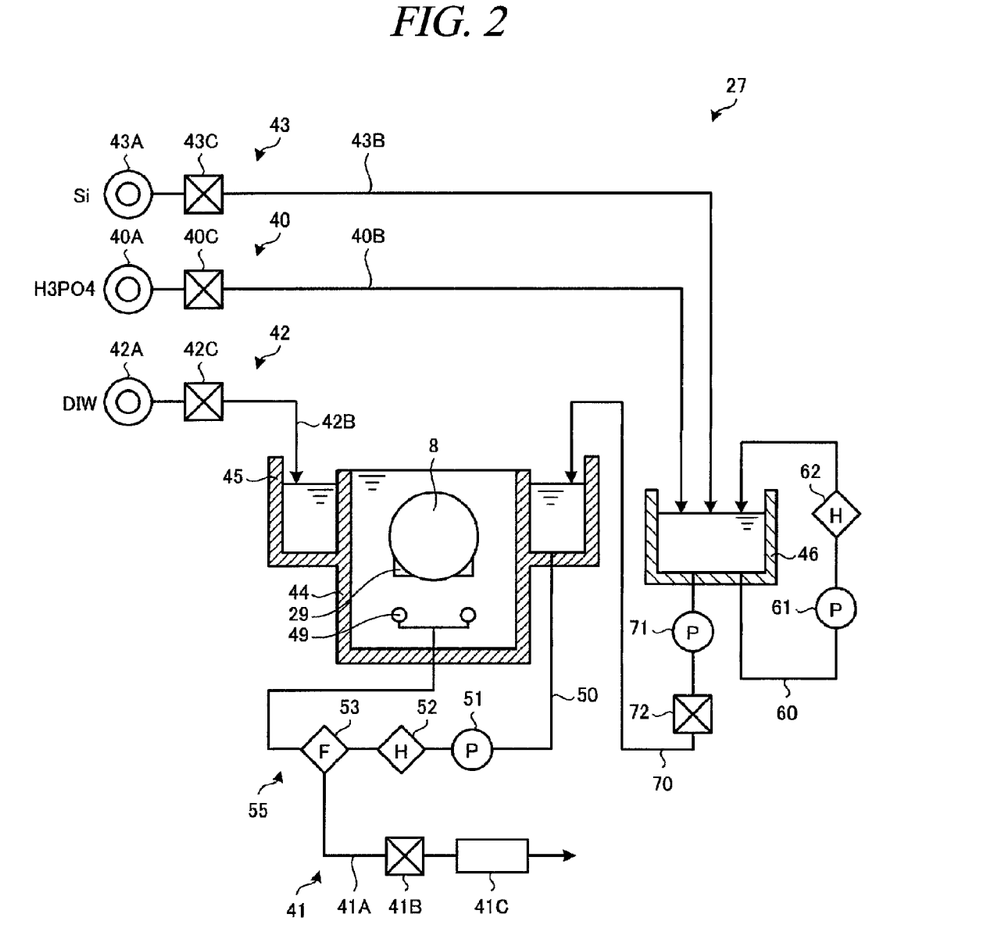
FIG. 2 is a schematic block diagram illustrating a configuration of a processing tub for etching according to an exemplary embodiment.

Now, the processing tub 27 for etching will be explained with reference to FIG. 2. FIG. 2 is a schematic block diagram illustrating a configuration of the processing tub 27 for etching according to the exemplary embodiment.

In the processing tub 27 for etching, between a silicon nitride film (SiN) 8A (see FIG. 3A) and a silicon oxide film ($SiO_2$) 8B (see FIG. 3A) formed on the substrate 8, only the silicon nitride film 8A is selectively etched by using an etching liquid.

In the etching processing for the nitride film, a solution, prepared by adding a silicon (Si)-containing compound to a phosphoric acid ($H_3PO_4$) aqueous solution, with an adjusted silicon concentration is generally used as the etching liquid. As a way to adjust the silicon concentration, a method of dissolving silicon by immersing a dummy substrate in a phosphoric acid aqueous solution (seasoning), a method of dissolving a silicon-containing compound such as colloidal silica in the phosphoric acid aqueous solution, or the like may be used. Further, there is also employed a method of adjusting the silicon concentration by adding a silicon-containing compound aqueous solution to the phosphoric acid aqueous solution.

The processing tub 27 for etching is equipped with a phosphoric acid aqueous solution supply unit 40, a phosphoric acid aqueous solution drain unit 41, a pure water supply unit 42, a silicon supply unit 43, an inner tub 44, an outer tub 45 and a temperature control tank 46.

The phosphoric acid aqueous solution supply unit 40 includes a phosphoric acid aqueous solution source 40A, a phosphoric acid aqueous solution supply line 40B and a first flow rate controller 40C.

The phosphoric acid aqueous solution source 40A is a tank configured to store the phosphoric acid aqueous solution therein. The phosphoric acid aqueous solution supply line 40B is configured to connect the phosphoric acid aqueous solution source 40A and the temperature control tank 46 and configured to supply the phosphoric acid aqueous solution from the phosphoric acid aqueous solution source 40A to the temperature control tank 46.

The first flow rate controller 40C is provided at the phosphoric acid aqueous solution supply line 40B and configured to adjust a flow rate of the phosphoric acid aqueous solution supplied to the temperature control tank 46. The first flow rate controller 40C may be composed of an opening/closing valve, a flow rate control valve, a flowmeter, and so forth.

The pure water supply unit 42 includes a pure water source 42A, a pure water supply line 42B, and a second flow rate controller 42C. The pure water supply unit 42 is configured to supply pure water (DIW) into the outer tub 45 to replenish moisture that has evaporated as the etching liquid is heated. Further, when replacing a part of the etching liquid, the pure water supply unit 42 supplies the pure water into the outer tub 45.

The pure water supply line 42B is configured to connect the pure water source 42A and the outer tub 45 and configured to supply the pure water of a preset temperature from the pure water source 42A into the outer tub 45.

The second flow rate controller 42C is provided at the pure water supply line 42B and configured to adjust a flow rate of the pure water supplied to the outer tub 45. The second flow rate controller 42C is composed of an opening/closing valve, a flow rate control valve, a flowmeter, and so forth.

The silicon supply unit 43 includes a silicon source 43A, a silicon supply line 43B and a third flow rate controller 43C.

The silicon source 43A is a tank which stores the silicon-containing compound aqueous solution therein. The silicon supply line 43B is configured to connect the silicon source 43A and the temperature control tank 46 and configured to supply the silicon-containing compound aqueous solution from the silicon source 43A into the temperature control tank 46.

The third flow rate controller 43C is provided at the silicon supply line 43B and configured to adjust a flow rate of the silicon-containing compound aqueous solution supplied to the temperature control tank 46. The third flow rate controller 43C is composed of an opening/closing valve, a flow rate control valve, a flowmeter, and so forth.

The silicon-containing compound aqueous solution is supplied in case of generating a reserve liquid which is supplied when replacing the etching liquid completely upon the completion of the etching processing. Further, the silicon supply unit 43 may be configured to supply the silicon-containing compound aqueous solution into the outer tub 45. In this case, the silicon supply unit 43 may supply the silicon-containing compound aqueous solution into the outer tub 45 when a silicon concentration in the etching liquid is decreased during the etching processing.

The inner tub 44 has an open top, and the etching liquid is supplied to near the top thereof. In the inner tub 44, the lot (the multiplicity of substrates 8) is immersed in the etching liquid by the substrate elevating device 29, so that the etching processing is performed on the substrates 8.

The outer tub 45 is disposed around an upper portion of the inner tub 44 and has an open top. The etching liquid overflown from the inner tub 44 is flown into the outer tub 45. Further, the reserve liquid is supplied into the outer tub 45 from the temperature control tank 46. Also, the pure water is supplied into the outer tub 45 from the pure water supply unit 42.

The outer tub 45 and the inner tub 44 are connected by a first circulation line 50. One end of the first circulation line 50 is connected to the outer tub 45, and the other end of the first circulation line 50 is connected to a processing liquid supply nozzle 49 provided within the inner tub 44.

The first circulation line 50 is provided with a first pump 51, a first heater 52 and a filter 53 in sequence from the outer tub 45 side. The etching liquid within the outer tub 45 is introduced into the inner tub 44 from the processing liquid supply nozzle 49 after being heated by the first heater 52. The first heater 52 adjusts a temperature of the etching liquid which is supplied into the inner tub 44.

By driving the first pump 51, the etching liquid is fed into the inner tub 44 from the outer tub 45 through the first circulation line 50. Further, the etching liquid is flown back into the outer tub 45 by being overflown from the inner tub 44. In this way, a circulation path 55 of the etching liquid is formed. That is, the circulation path 55 is formed by the outer tub 45, the first circulation line 50 and the inner tub 44. In the circulation path 55, the inner tub 44, the outer tub 45 and the first heater 52 are provided in sequence from an upstream side of the circulation path 55.

In the temperature control tank 46, the phosphoric acid aqueous solution supplied from the phosphoric acid aqueous solution supply unit 40 is stored as the reserve liquid. Further, in the temperature control tank 46, the phosphoric acid aqueous solution supplied from the phosphoric acid aqueous solution supply unit 40 and the silicon-containing compound aqueous solution supplied from the silicon supply unit 43 are mixed and stored as the reserve liquid.

By way of example, in case of replacing the whole of the etching liquid within the inner tub 44 and the outer tub 45 completely, the reserve liquid composed of the mixture of the phosphoric acid aqueous solution and the silicon-containing compound aqueous solution is generated to be stored in the temperature control tank 46. Meanwhile, in case of replacing a part of the etching liquid during the etching processing, the phosphoric acid aqueous solution is stored in the temperature control tank 46 as the reserve liquid.

A second circulation line 60 configured to circulate the reserve liquid within the temperature control tank 46 is connected to the temperature control tank 46. Further, one end of a supply line 70 is connected to the temperature control tank 46. The other end of the supply line 70 is connected to the outer tub 45.

The second circulation line 60 is equipped with a second pump 61 and a second heater 62. By driving the second pump 61 with the second heater 62 turned ON, the reserve liquid within the temperature control tank 46 is circulated while being heated. The second heater 62 adjusts a temperature of the reserve liquid.

The supply line 70 is provided with a third pump 71 and a fourth flow rate controller 72. The fourth flow rate controller 72 is configured to adjust a flow rate of the reserve liquid supplied into the outer tub 45. The fourth flow rate controller 72 is composed of an opening/closing valve, a flow rate control valve, a flow meter, and the like.

The reserve liquid stored in the temperature control tank 46 is supplied into the outer tub 45 through the supply line 70 when replacing the whole or a part of the etching liquid.

The phosphoric acid aqueous solution drain unit 41 is configured to drain the etching liquid when replacing the whole or the part of the etching liquid used in the etching processing. The phosphoric acid aqueous solution drain unit 41 includes a drain line 41A, a fifth flow rate controller 41B and a cooling tank 41C.

The drain line 41A is connected to the first circulation line 50. The fifth flow rate controller 41B is provided at the drain line 41A and configured to adjust a drain amount of the etching liquid. The fifth flow rate controller 41B is composed of an opening/closing valve, a flow rate control valve, a flowmeter, and so forth. The cooling tank 41C temporarily stores therein and cools the etching liquid flown through the drain line 41A.

Further, opening/closing operations of the opening/closing valves and opening degrees of the flow rate control valves, which constitute the first to fifth flow rate controllers 40C to 41B, are changed as actuators (not shown) are operated based on signals from the control unit 100. That is, the opening/closing valves and the flow rate control valves constituting the first to fifth flow rate controllers 40C to 41B are controlled by the control unit 100.

Referring back to FIG. 1, the control unit 100 controls operations of individual components (the carrier carry-in/out unit 2, the lot forming unit 3, the lot placing unit 4, the lot transferring unit 5, and the lot processing unit 6) of the substrate processing apparatus 1. The control unit 100 controls the operations of the individual components of the substrate processing apparatus 1 based on signals from switches or the like.

The control unit 100 may be implemented by, for example, a computer and has a computer-readable recording medium 38. The recording medium 38 stores therein programs for controlling various types of processings performed in the substrate processing apparatus 1.

The control unit 100 controls the operation of the substrate processing apparatus 1 by reading and executing the programs stored in the recording medium 38. Further, the programs are stored in the compute-readable recording medium 38 and may be installed to the recording medium 38 of the control unit 100 from another recording medium.

The computer-readable recording medium 38 may be implemented by, by way of non-limiting example, a hard disk HD, a flexible disk FD, a compact disk CD, a magnet optical disk MO, a memory card, or the like.

Figure 3A:
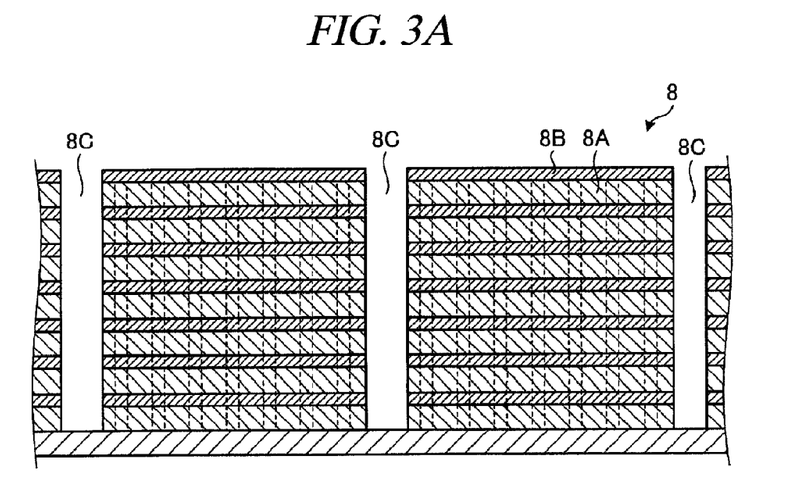
FIG. 3A is a schematic diagram illustrating a cross section of a substrate before being subjected to an etching processing.
Figure 3B:
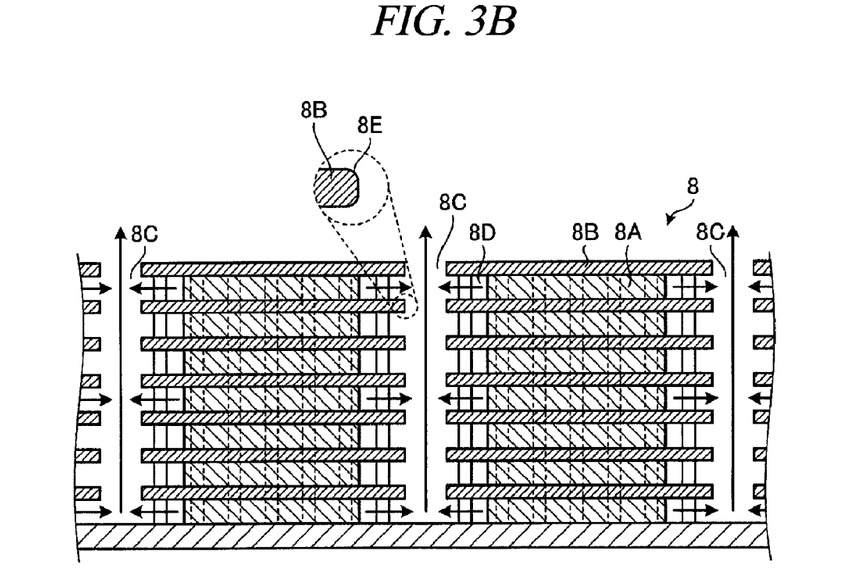
FIG. 3B is a schematic diagram illustrating a state of the substrate while the etching processing is being performed.
Figure 3C:
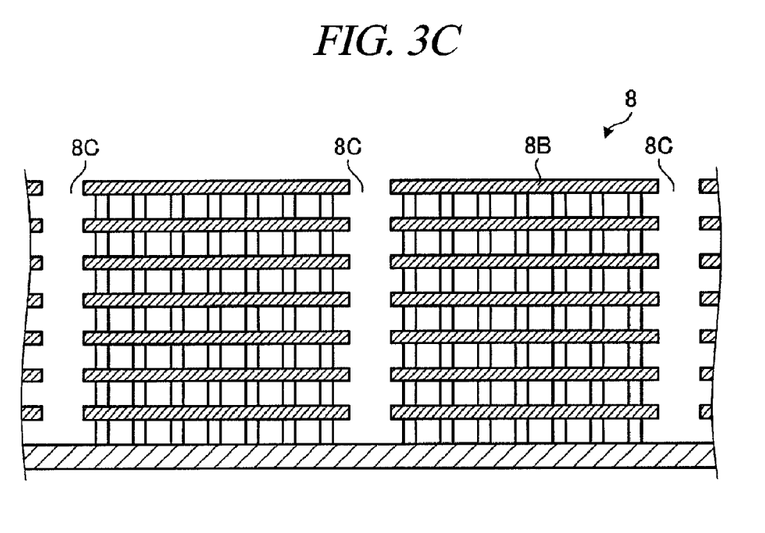
FIG. 3C is a schematic diagram illustrating a state of the substrate after being subjected to the etching processing.

Here, the etching processing will be discussed with reference to FIG. 3A to FIG. 3C. FIG. 3A is a schematic diagram illustrating a cross section of the substrate 8 before being subjected to the etching processing. FIG. 3B is a schematic diagram illustrating a state of the substrate 8 while the etching processing is being performed. FIG. 3C is a schematic diagram illustrating a state of the substrate 8 after being subjected to the etching processing.

As depicted in FIG. 3A, on the substrate 8 before being subjected to the etching processing, the silicon nitride film 8A and the silicon oxide film 8B are alternately stacked on top of each other in multiple layers. Further, the substrate 8 is provided with a multiple number of grooves 8C in which the etching liquid is filled to etch the stacked silicon nitride films 8A.

If the etching processing is begun by immersing the substrate 8 in the inner tub 44, a portion of the silicon nitride film 8A near the groove 8C is first etched, as illustrated in FIG. 3B. That is, in the etching processing, the silicon nitride films 8A is etched in sequence starting from the portion thereof closer to the groove 8C.

A component of the silicon nitride film 8A eluted into the etching liquid by the etching is guided into the groove 8C from a gap 8D formed as the silicon nitride film 8A is etched, and then, is discharged to the outside of the substrate 8 from the groove 8C. The etching processing progresses as the etching liquid in the groove 8C or the gap 8D is replaced by a new etching liquid.

Further, an end portion 8E of the silicon oxide film 8B at the side of the groove 8C becomes to have a rounded shape as corners thereof are etched by the etching.

If the etching processing progresses further, the gaps 8D at both sides are connected, as illustrated in FIG. 3C.

In the substrate processing apparatus 1 according to the exemplary embodiment, the etching processing is performed by a method to be described below.

When beginning the etching processing, a phosphoric acid concentration of the etching liquid is set to an initial phosphoric acid concentration; a temperature of the etching liquid is set to an initial temperature; and a silicon concentration of the etching liquid is set to an initial silicon concentration.

The initial phosphoric acid concentration is a preset concentration and may be, for example, 86%. The initial temperature is previously set and is a temperature at which the etching liquid comes into a boiling state. The initial silicon concentration is a previously set concentration and may be, by way of non-limiting example, 120 ppm.

Figure 4:
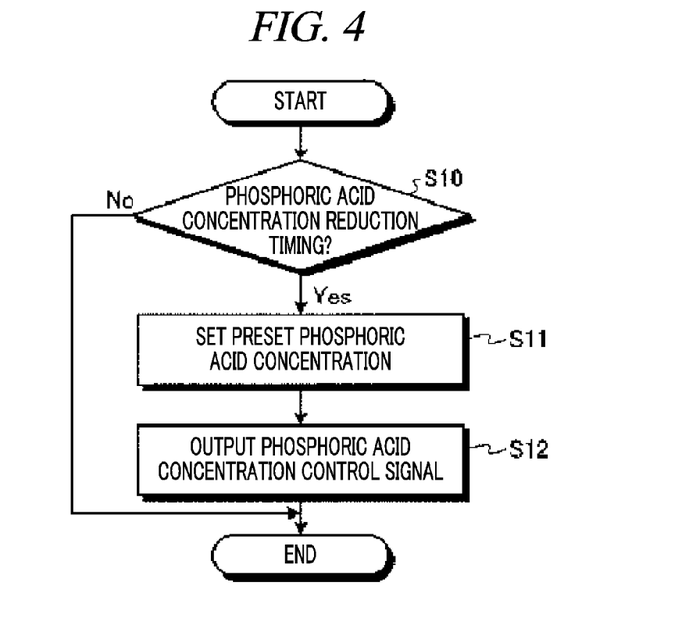
FIG. 4 is a flowchart for describing a phosphoric acid concentration control in the etching processing.

First, a phosphoric acid concentration control in the etching processing will be explained with reference to FIG. 4. FIG. 4 is a flowchart for describing the phosphoric acid concentration control of the etching processing.

The control unit 100 determines whether it is a phosphoric acid concentration reduction timing (S10). The control unit 100 makes this determination based on previously set information. To elaborate, the control unit 100 determines whether a processing time of the etching processing has reached a preset phosphoric acid concentration reduction time.

Multiple phosphoric acid concentration reduction times are set by dividing a time period during which the etching processing is performed. By way of example, six phosphoric acid concentration reduction times are set: a first phosphoric acid concentration reduction time to a sixth phosphoric acid concentration reduction time. By way of example, the first to sixth phosphoric acid concentration reduction times are set at an equal interval therebetween.

If the processing time elapsed from the beginning of the etching processing reaches the first phosphoric acid concentration reduction time, the control unit 100 determines that it is the phosphoric acid concentration reduction timing. Further, if the processing time reaches the second phosphoric acid concentration reduction time longer than the first phosphoric acid concentration reduction time, the control unit 100 determines that it is the phosphoric acid concentration reduction timing. In this way, whenever the processing time reaches each phosphoric acid concentration reduction time, the control unit 100 makes a determination that it is the phosphoric acid concentration reduction timing.

If it is not the phosphoric acid concentration reduction timing (S10: No), the control unit 100 ends the current processing.

If it is the phosphoric acid concentration reduction timing (S10: Yes), the control unit 100 sets the phosphoric acid concentration of the etching liquid to a preset phosphoric acid concentration according to the phosphoric acid concentration reduction timing (S11).

The preset phosphoric acid concentration is set into six stages: a first preset phosphoric acid concentration to a sixth preset phosphoric acid concentration. The preset phosphoric acid concentration is set to be gradually decreased from the first preset phosphoric acid concentration to the sixth preset phosphoric acid concentration. The sixth preset phosphoric acid concentration is a final phosphoric acid concentration and may be, for example, 82%.

By way of example, if the processing time reaches the first phosphoric acid concentration reduction time, the control unit 100 sets the phosphoric acid concentration of the etching liquid to the first preset phosphoric acid concentration which is lower than the initial phosphoric acid concentration. Further, if the processing time reaches the second phosphoric acid concentration reduction time, the control unit 100 sets the phosphoric acid concentration of the etching liquid to the second preset phosphoric acid concentration which is lower than the first preset phosphoric acid concentration.

As stated above, the control unit 100 sets the preset phosphoric acid concentration in a step manner such that the phosphoric acid concentration is reduced whenever the processing time reaches each phosphoric acid concentration reduction time.

The control unit 100 outputs a phosphoric acid concentration control signal such that the phosphoric acid concentration of the etching liquid reaches the preset phosphoric acid concentration (S12). By way of example, the control unit 100 outputs a signal for draining a part of the etching liquid. Further, the control unit 100 outputs a signal for supplying a new liquid, for example, DIW. In addition, the control unit 100 may output a signal for supplying the reserve liquid from the temperature control tank 46 to adjust the phosphoric acid concentration.

As stated above, by reducing the phosphoric acid concentration of the etching liquid as the etching processing progresses, the selectivity for selectively etching the silicon nitride film 8A can be improved even in a latter stage of the etching processing.

Further, the control unit 100 controls the phosphoric acid concentration to be maintained equal to or higher than a preset concentration for a predetermined time period after the etching processing is begun. The preset concentration may be a concentration at which the end portion 8E of the silicon oxide film 8B is etched such that the end portion 8E of the silicon oxide film 8B at the side of the groove 8C becomes to have the rounded shape, as shown in FIG. 3B. Accordingly, when performing a processing of filling the gap 8D between the silicon oxide films 8B with a solution after the etching processing, the solution can be easily filled therein.

By way of example, the predetermined time period is the first phosphoric acid concentration reduction time, and the preset concentration is the first preset phosphoric acid concentration. Furthermore, the predetermined time period may be the second phosphoric acid concentration reduction time or the like, and the preset concentration may be the second preset phosphoric acid concentration, or the like.

Figure 5:
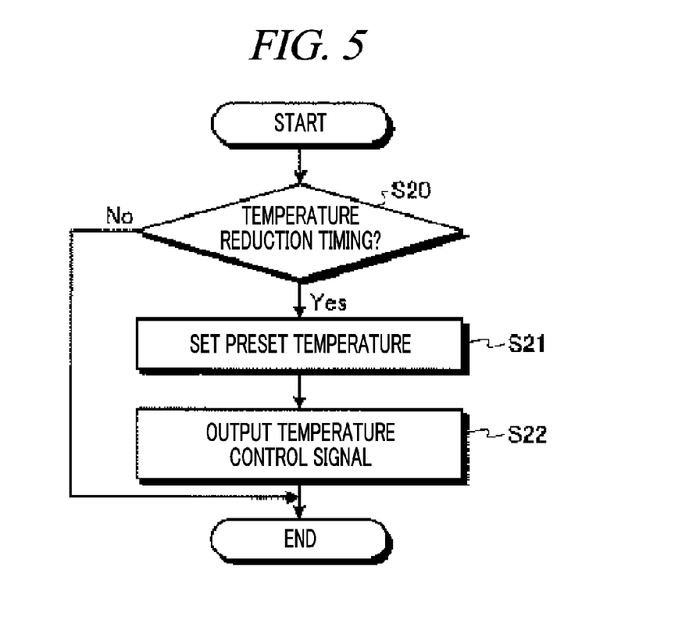
FIG. 5 is a flowchart for describing a temperature control in the etching process.

Now, a temperature control in the etching processing will be explained with reference to FIG. 5. FIG. 5 is a flowchart for describing the temperature control in the etching processing.

The control unit 100 determines whether it is a temperature reduction timing (S20). The control unit 100 makes this determination based on previously set information. To elaborate, the control unit 100 determines whether the processing time of the etching processing has reached a preset temperature reduction time.

Multiple temperature reduction times are set by dividing the time period during which the etching processing is performed. By way of example, six temperature reduction times are set: a first temperature reduction time to a sixth temperature reduction time. By way of example, the first to sixth temperature reduction times are set at an equal interval therebetween.

If the processing time elapsed from the beginning of the etching processing reaches the first temperature reduction time, the control unit 100 determines that it is the temperature reduction timing. Further, if the processing time reaches the second temperature reduction time longer than the first temperature reduction time, the control unit 100 determines that it is the temperature reduction timing. In this way, whenever the processing time reaches each temperature reduction time, the control unit 100 makes a determination that it is the temperature reduction timing.

If it is not the temperature reduction timing (S20: No), the control unit 100 ends the current processing.

If it is the temperature reduction timing (S20: Yes), the control unit 100 sets the temperature of the etching liquid to a preset temperature according to the temperature reduction timing (S21).

The preset temperature is set into six stages: a first preset temperature to a sixth preset temperature. The preset temperature is set to be gradually decreased from the first preset temperature to the sixth preset temperature. The sixth preset temperature is a final temperature of the etching liquid. The preset temperature is set such that the etching liquid is maintained in the boiling state even if the phosphoric acid concentration of the etching liquid is reduced through the aforementioned phosphoric acid concentration control.

By way of example, if the processing time reaches the first temperature reduction time, the control unit 100 sets the temperature of the etching liquid to the first preset temperature which is lower than the initial temperature. Further, if the processing time reaches the second temperature reduction time, the control unit 100 sets the temperature of the etching liquid to the second preset temperature which is lower than the first preset temperature.

As stated above, the control unit 100 sets the preset temperature in a step manner such that the temperature of the etching liquid is reduced whenever the processing time reaches each temperature reduction time.

The control unit 100 outputs a temperature control signal such that the temperature of the etching liquid reaches the preset temperature (S22). By way of example, the control unit 100 outputs a signal for reducing a heating amount of the etching liquid by the first heater 52. Further, the same as in the phosphoric acid concentration control, the control unit 100 outputs a signal for draining a part of the etching liquid. Furthermore, the control unit 100 outputs a signal for supplying the DIW. In addition, the control unit 100 may output a signal for supplying the reserve liquid from the temperature control tank 46. In case of supplying the reserve liquid from the temperature control tank 46, the control unit 100 may output a signal for adjusting the temperature of the reserve liquid by the second heater 62.

If the phosphoric acid concentration of the etching liquid is lowered through the above-described phosphoric acid concentration control, the etching liquid is likely to be boiled. In view of this, the control unit 100 maintains the etching liquid in the boiling state by decreasing the temperature of the etching liquid as the phosphoric acid concentration of the etching liquid is decreased with a lapse of the processing time. Accordingly, the etching processing can be performed on the substrate 8 in the preset boiling state, so that non-uniformity in the processing upon the substrate 8 can be suppressed.

Figure 6:
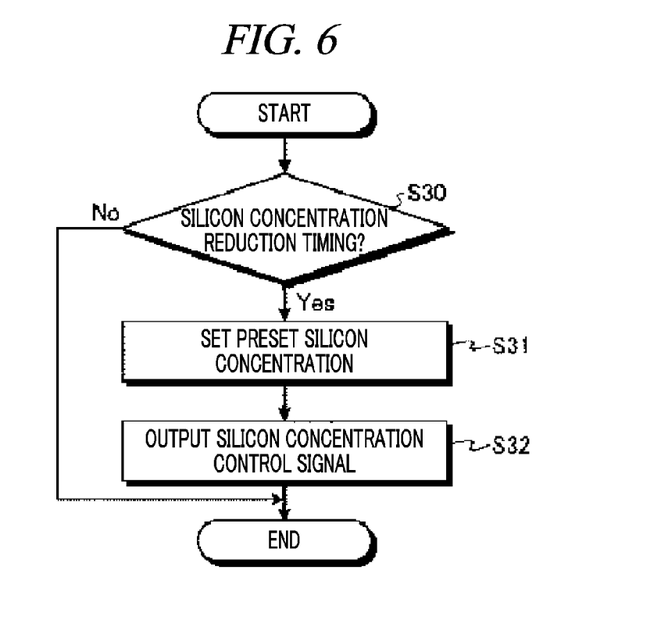
FIG. 6 is a flowchart for describing a silicon concentration control in the etching processing.

Now, a silicon concentration control in the etching processing will be explained with reference to FIG. 6. FIG. 6 is a flowchart for describing the silicon concentration control in the etching processing.

The control unit 100 determines whether it is a silicon concentration reduction timing (S30). The control unit 100 makes this determination based on previously set information. To elaborate, the control unit 100 determines whether the processing time of the etching processing has reached a preset silicon concentration reduction time.

Multiple silicon concentration reduction times are set by dividing the time period during which the etching processing is performed. By way of example, seven silicon concentration reduction times are set: a first silicon concentration reduction time to a seventh silicon concentration reduction time. By way of example, the first to seventh silicon concentration reduction times are set at an equal interval therebetween.

If the processing time elapsed from the beginning of the etching processing reaches the first silicon concentration reduction time, the control unit 100 determines that it is the silicon concentration reduction timing. Further, if the processing time reaches the second silicon concentration reduction time longer than the first silicon concentration reduction time, the control unit 100 determines that it is the silicon concentration reduction timing. In this way, whenever the processing time reaches each silicon concentration reduction time, the control unit 100 makes a determination that it is the silicon concentration reduction timing.

If it is not the silicon concentration reduction timing (S30: No), the control unit 100 ends the current processing.

If it is the silicon concentration reduction timing (S30: Yes), the control unit 100 sets the silicon concentration of the etching liquid to a preset silicon concentration according to the silicon concentration reduction timing (S31).

The preset silicon concentration is set into seven stages: a first preset silicon concentration to a seventh preset silicon concentration. The preset silicon concentration is set to be gradually decreased from the first preset silicon concentration to the seventh preset silicon concentration. The seventh preset silicon concentration is a final silicon concentration and may be, for example, 100 ppm.

By way of example, if the processing time reaches the first silicon concentration reduction time, the control unit 100 sets the silicon concentration of the etching liquid to the first preset silicon concentration which is lower than the initial silicon concentration. Further, if the processing time reaches the second silicon concentration reduction time, the control unit 100 sets the silicon concentration of the etching liquid to the second preset silicon concentration which is lower than the first preset silicon concentration.

As stated above, the control unit 100 sets the preset silicon concentration in a step manner such that the silicon concentration is reduced whenever the processing time reaches each silicon concentration reduction time.

The control unit 100 outputs a silicon concentration control signal such that the silicon concentration of the etching liquid reaches the preset silicon concentration (S32). By way of example, the same as in the phosphoric acid concentration control, the control unit 100 outputs a signal for draining a part of the etching liquid. Further, the control unit 100 outputs a signal for supplying the DIW. In addition, the control unit 100 may output a signal for supplying the reserve liquid from the temperature control tank 46.

In the etching processing, as the etching processing progresses, the silicon nitride film 8A (see FIG. 3B) is etched, and as the silicon nitride film 8A is eluted into the etching liquid, the silicon concentration of the etching liquid is increased in overall. For the reason, the control unit 100 drains a part of the etching liquid and supplies, for example, the DIW.

Figure 7:
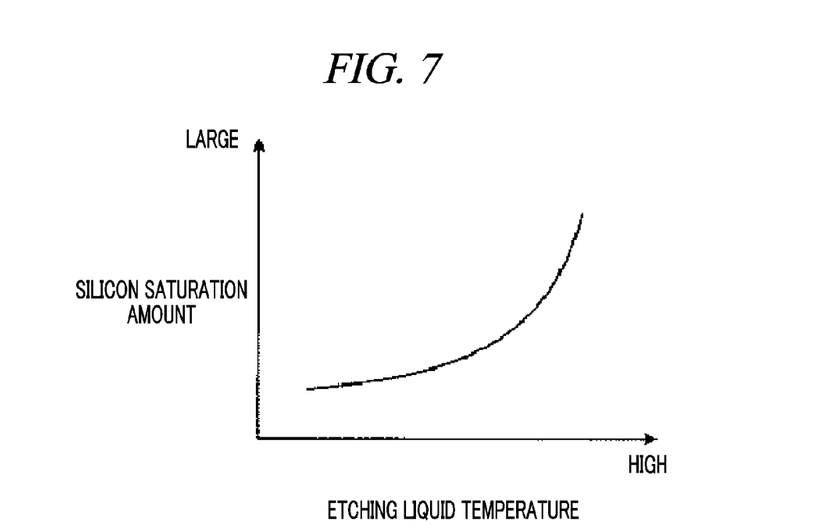
FIG. 7 is a map showing a relationship between a temperature of an etching liquid and a silicon saturation amount.

Further, a silicon saturation amount in the etching liquid is decreased as the temperature of the etching liquid decreases, as shown in FIG. 7. That is, if the temperature of the etching liquid is lowered, a silicon oxide may be easily precipitated. FIG. 7 is a map showing a relationship between the temperature of the etching liquid and the silicon saturation amount.

In view of this, the control unit 100 reduces the preset silicon concentration as the temperature of the etching liquid is reduced through the above-described temperature control, that is, as the etching processing progresses.

As stated above, by reducing the silicon concentration of the etching liquid as the etching processing progresses, the precipitation of the silicon oxide can be suppressed.

Figure 8:
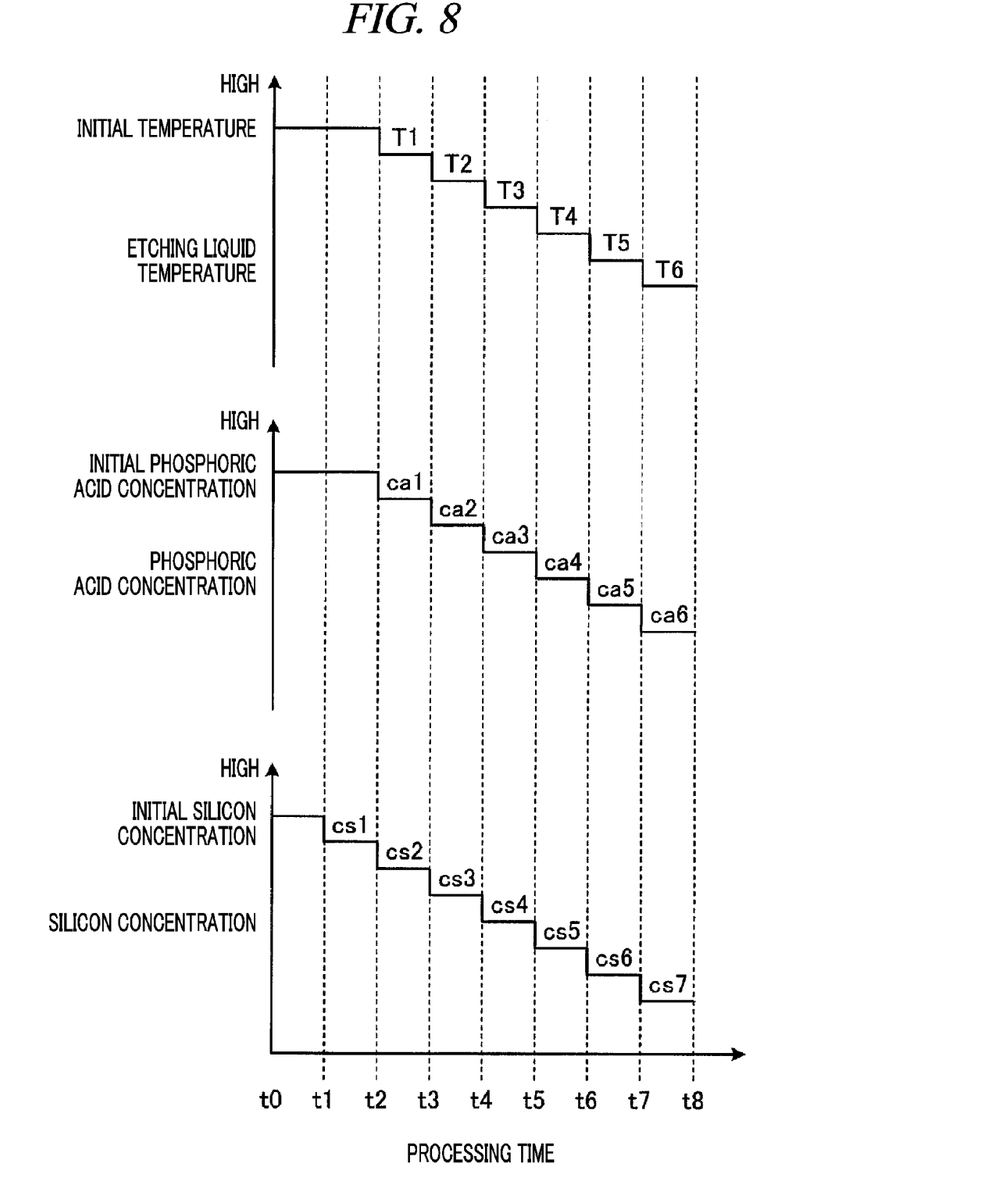
FIG. 8 is a time chart showing a temperature, a phosphoric acid concentration and a silicon concentration of the etching liquid with respect to a processing time.

As discussed above, as the phosphoric acid concentration control, the temperature control and the silicon concentration control are performed, the phosphoric acid concentration, the temperature and the silicon concentration of the etching liquid are reduced with the lapse of the processing time, as depicted in FIG. 8. FIG. 8 is a time chart showing the phosphoric acid concentration, the temperature and the silicon concentration of the etching liquid with respect to the processing time. Further, actual phosphoric acid concentration, temperature and silicon concentration of the etching liquid are varied according to the respective set values.

When beginning the etching processing at a time t0, the temperature of the etching liquid is set at the initial temperature; the phosphoric acid concentration of the etching liquid is set to the initial phosphoric acid concentration; and the silicon concentration of the etching liquid is set at the initial silicon concentration.

If the processing time reaches the first silicon concentration reduction time at a time t1, the silicon concentration is set to the first preset silicon concentration cs1.

If the processing time reaches the first phosphoric acid concentration reduction time, the first temperature reduction time and the second silicon concentration reduction time at a time t2, the phosphoric acid concentration is set to the first preset phosphoric acid concentration ca1; the temperature of the etching liquid is set to the first preset temperature T1; and the silicon concentration is set to the second preset silicon concentration cs2.

Further, in the present exemplary embodiment, a timing for reducing the phosphoric acid concentration for the first time is later than a timing for reducing the silicon concentration for the first time. The timings are set in this way to maintain the phosphoric acid concentration higher than the preset concentration and to etch the end portion 8E (see FIG. 3B) of the silicon oxide film 8B to have the rounded shape, as stated above.

Thereafter, at respective times t3 to t6 with the lapse of the processing time, the phosphoric acid concentration is set to the second preset phosphoric acid concentration cat to the fifth preset phosphoric acid concentration ca5; the temperature of the etching liquid is set to the second preset temperature T2 to the fifth preset temperature T5; and the silicon concentration is set to the third preset silicon concentration cs3 to the sixth preset silicon concentration cs6.

Then, if the processing time reaches the sixth phosphoric acid concentration reduction time, the sixth temperature reduction time and the seventh silicon concentration reduction time at a time t7, the phosphoric acid concentration is set to the sixth preset phosphoric acid concentration ca6; the temperature of the etching liquid is set to the sixth preset temperature T6; and the silicon concentration is set to the seventh preset silicon concentration cs7.

From the time t7 to a time t8, over-etching is performed. Accordingly, it is possible to suppress the silicon nitride film 8A from being left unetched on the substrate 8.

Further, the phosphoric acid concentration reduction timing, the temperature reduction timing and the silicon concentration reduction timing may be set to be different. By way of example, the first phosphoric acid concentration reduction time, the first temperature reduction time and the second silicon concentration reduction time may be set to be all different.

Alternately, one of the phosphoric acid concentration reduction timing, the temperature reduction timing and the silicon concentration reduction timing may be set to be different from the others. By way of example, the first phosphoric acid concentration reduction time and the first temperature reduction time may be set to be same, whereas the second silicon concentration reduction time may be set to be different.

The substrate processing apparatus 1 performs the etching processing with the etching liquid having a first phosphoric acid concentration during a first processing time of the etching processing, and then, performs the etching processing with the etching liquid having a second phosphoric acid concentration lower than the first phosphoric acid concentration during a second processing time after the first processing time. That is, the substrate processing apparatus 1 reduces the phosphoric acid concentration of the etching liquid as the etching processing progresses. Accordingly, even in a latter stage of the etching processing, the selectivity for selectively etching the silicon nitride film 8A can be improved. Therefore, the etching processing can be performed with high accuracy.

Besides, the substrate processing apparatus 1 performs the etching processing with the etching liquid having a first silicon concentration during the first processing time and, then, performs the etching processing with the etching liquid having a second silicon concentration lower than the first silicon concentration during the second processing time. That is, the substrate processing apparatus 1 reduces the silicon concentration of the etching liquid as the etching processing progresses. Accordingly, the precipitation of the silicon oxide can be suppressed. Therefore, the etching processing can be performed with high accuracy.

Furthermore, the substrate processing apparatus 1 performs the etching processing with the etching liquid having a first temperature during the first processing time and, then, performs the etching processing with the etching liquid having a second temperature lower than the first temperature during the second processing time. To be specific, the substrate processing apparatus 1 performs the etching processing at the temperatures at which the etching liquid is maintained in the preset boiling state.

Accordingly, even if the phosphoric acid concentration is lowered, the substrate processing apparatus 1 is capable of maintaining the etching liquid in the preset boiling state. Therefore, the etching processing can be performed in the preset boiling state, so that the non-uniformity in the processing upon the substrate 8 can be suppressed.

In addition, the substrate processing apparatus 1 drains a part of the etching liquid and newly supplies the DIW or the like based on the processing time which is the previously set information. Accordingly, it is possible to easily control the phosphoric acid concentration of the etching liquid or the like based on the processing time.

Further, the substrate processing apparatus 1 maintains the phosphoric acid concentration of the etching liquid equal to or higher than the preset concentration during the predetermined time period after the beginning of the etching processing. Accordingly, the end portion 8E of the silicon oxide film 8B of the substrate 8 is etched, and the end portion 8E of the silicon oxide film 8B can be made to have the rounded shape. Therefore, after the etching processing, in case of performing the processing of filling the gap 8D formed between the silicon oxide films 8B with the solution, the solution can be filled therein easily.

Figure 9:
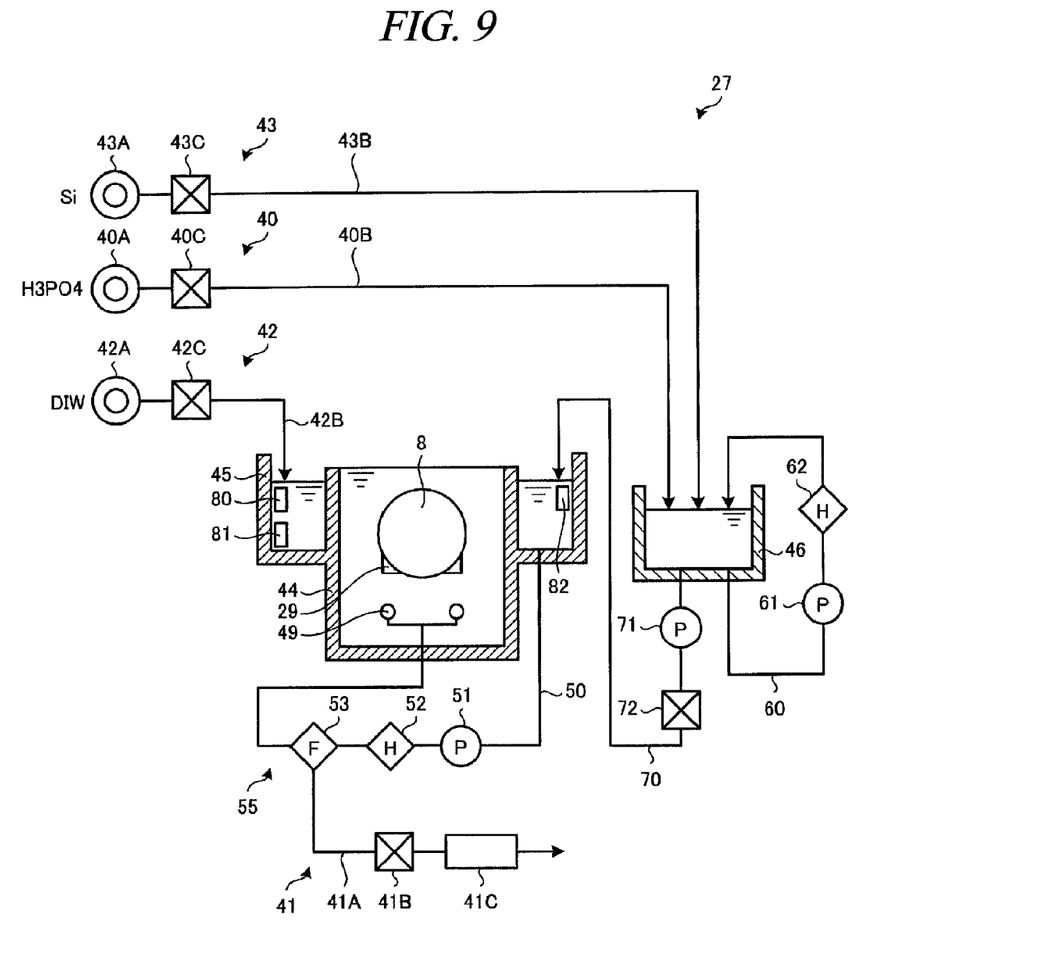
FIG. 9 is a schematic block diagram illustrating a configuration of a processing tub for etching according to a modification example.

In a substrate processing apparatus 1 according to a modification example, the supply line 70 is connected to the inner tub 44 so that the reserve liquid can be supplied into the inner tub 44 from the temperature control tank 46.

Further, the substrate processing apparatus 1 according to the modification example may be configured to supply a $SiO_2$ precipitation inhibitor to suppress precipitation of the silicon oxide. The $SiO_2$ precipitation inhibitor is not particularly limited as long as it contains a component capable of suppressing precipitation of a silicon oxide by stabilizing silicon ions dissolved in the phosphoric acid aqueous solution in a dissolved state. By way of example, a hexafluorosilicic acid ($H_2SiF_6$) aqueous solution containing a fluorine component may be used. Here, an additive such as ammonia may be added to stabilize hexafluorosilicic acid in the aqueous solution.

The $SiO_2$ precipitation inhibitor may be implemented by, by way of non-limiting example, ammonium hexafluorosilicate (($NH_4)_2SiF_6$), sodium hexafluorosilicate ($Na_2SiF_6$), or the like.

Referring to FIG. 9, the substrate processing apparatus 1 according to the modification example may detect the temperature of the etching liquid by a temperature sensor 80, the phosphoric acid concentration of the etching liquid by a phosphoric acid concentration sensor 81, the silicon concentration of the etching liquid by a silicon concentration sensor 82. Further, the substrate processing apparatus 1 according to the modification example may adjust and control the temperature, the phosphoric acid concentration or the silicon concentration of the etching liquid based on the detected value. FIG. 9 is a schematic block diagram illustrating a configuration of a processing tub 27 for etching according to the modification example. With this configuration, the phosphoric acid concentration of the etching liquid can be controlled accurately, for example, so that the etching processing can be performed with higher accuracy. Further, the silicon concentration sensor 82 may be provided at the first circulation line 50.

In addition, the substrate processing apparatus 1 according to the modification example may reduce the preset phosphoric acid concentration, the preset temperature and the preset silicon concentration continuously. By way of example, the preset phosphoric acid concentration may be reduced continuously in a straight line shape or in a curved line shape. Further, the substrate processing apparatus 1 according to the modification example may reduce the preset phosphoric acid concentration, the preset temperature and the preset silicon concentration in a step manner within a certain time period and continuously in another time period during the etching processing. That is, the substrate processing apparatus 1 only needs to reduce the preset phosphoric acid concentration, the preset temperature and the preset silicon concentration as the processing time elapses. As a result, the etching processing can be performed with high accuracy.

Further, the substrate processing apparatus 1 according to the modification example may maintain the silicon concentration at the preset silicon concentration during the etching processing.

Furthermore, the substrate processing apparatus 1 according to the modification example may increase the temperature, the phosphoric acid concentration and the silicon concentration of the etching liquid during the over-etching. It is because there hardly occurs elution of the silicon nitride film 8A during the over-etching. Accordingly, a time required for the over-etching can be shortened, so that the etching processing time can be shortened. Further, a timing for increasing the temperature of the etching liquid, a timing for increasing the phosphoric acid concentration, a timing for increasing the silicon concentration may be set to be all different.

Although the above-described substrate processing apparatus 1 is configured to process the multiplicity of substrates 8 at the same time, the substrate processing apparatus 1 may be configured as a single-wafer type processing apparatus configured to process the substrates 8 one by one.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a processing unit configured to perform an etching processing by immersing a substrate in a processing liquid containing phosphoric acid and a silicon-containing compound; and
a control unit configured to control the processing liquid such that the substrate is processed, in a first processing time of the etching processing, with the processing liquid having a first phosphoric acid concentration and a first silicon concentration, and the substrate is processed, in a second processing time later than the first processing time, with the processing liquid having a second preset phosphoric acid concentration lower than the first phosphoric acid concentration and a second preset silicon concentration lower than the first silicon concentration or with the processing liquid having the second preset phosphoric acid concentration and the first silicon concentration.

2. The substrate processing apparatus of claim 1,
wherein the control unit controls the processing liquid such that the substrate is processed with the processing liquid having a first temperature in the first processing time and the substrate is processed with the processing liquid having a second temperature lower than the first temperature in the second processing time.

3. The substrate processing apparatus of claim 2,
wherein the first temperature and the second temperature are temperatures at which the processing liquid comes into a boiling state.

4. The substrate processing apparatus of claim 3,
wherein the control unit drains a part of the processing liquid and newly supplies a liquid based on previously set information.

5. The substrate processing apparatus of claim 3,
wherein the control unit drains a part of the processing liquid and newly supplies a liquid based on a silicon concentration of the processing liquid.

6. The substrate processing apparatus of claim 3,
wherein during a predetermined time period after beginning the etching processing, the control unit maintains a phosphoric acid concentration equal to or higher than a preset concentration at which a silicon oxide film of the substrate is etched.

7. The substrate processing apparatus of claim 2,
wherein the control unit drains a part of the processing liquid and newly supplies a liquid based on previously set information.

8. The substrate processing apparatus of claim 2,
wherein the control unit drains a part of the processing liquid and newly supplies a liquid based on a silicon concentration of the processing liquid.

9. The substrate processing apparatus of claim 2,
wherein during a predetermined time period after beginning the etching processing, the control unit maintains a phosphoric acid concentration equal to or higher than a preset concentration at which a silicon oxide film of the substrate is etched.

10. The substrate processing apparatus of claim 1,
wherein the control unit drains a part of the processing liquid and newly supplies a liquid based on previously set information.

11. The substrate processing apparatus of claim 10,
wherein during a predetermined time period after beginning the etching processing, the control unit maintains a phosphoric acid concentration equal to or higher than a preset concentration at which a silicon oxide film of the substrate is etched.

12. The substrate processing apparatus of claim 1,
wherein during a predetermined time period after beginning the etching processing, the control unit maintains a phosphoric acid concentration equal to or higher than a preset concentration at which a silicon oxide film of the substrate is etched.

13. A substrate processing method, comprising:
processing, when performing an etching processing by immersing a substrate in a processing liquid containing phosphoric acid and a silicon-containing compound, the substrate with the processing liquid having a first phosphoric acid concentration and a first silicon concentration in a first processing time of the etching processing; and
processing, in a second processing time later than the first processing time, the substrate with the processing liquid having a second preset phosphoric acid concentration lower than the first phosphoric acid concentration and a second preset silicon concentration lower than the first silicon concentration or with the processing liquid having the second preset phosphoric acid concentration and the first silicon concentration.

14. A computer-readable recording medium having stored thereon computer-executable instructions that, in response to execution, cause a substrate processing apparatus to perform a substrate processing method as claimed in claim 13.

* * * * *